United States Patent
Choi et al.

(10) Patent No.: US 6,774,055 B2
(45) Date of Patent: Aug. 10, 2004

(54) IN-LINE SYSTEM HAVING OVERLAY ACCURACY MEASUREMENT FUNCTION AND METHOD FOR THE SAME

(75) Inventors: Jae-Young Choi, Seoul (KR); Tae-Sin Park, Suwon (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/059,483

(22) Filed: Jan. 29, 2002

(65) Prior Publication Data

US 2003/0017630 A1 Jan. 23, 2003

(30) Foreign Application Priority Data

Jul. 18, 2001 (KR) ........................................ 2001-43048

(51) Int. Cl.⁷ ............................................. H01I 21/477
(52) U.S. Cl. ..................................... 438/782; 438/800
(58) Field of Search .......................... 438/15, 18, 401, 438/975, DIG. 102, 5, 462, 800, 782; 430/22; 702/94; 356/400, 401

(56) References Cited

U.S. PATENT DOCUMENTS

| | | | | |
|---|---|---|---|---|
| 5,879,843 A | * | 3/1999 | Ueno | 430/22 |
| 6,092,031 A | * | 7/2000 | Yasuda | 702/94 |
| 6,266,144 B1 | * | 7/2001 | Li | 356/401 |
| 6,465,322 B2 | * | 10/2002 | Ziger et al. | 438/401 |

* cited by examiner

*Primary Examiner*—Long Pham
*Assistant Examiner*—Hoa B. Trinh
(74) *Attorney, Agent, or Firm*—F. Chau & Associates, LLC

(57) ABSTRACT

An in-line system having an overlay measurement function and a method thereof capable of reducing overlay measurement time and simplifying related jobs are disclosed. The system for performing wafer processing comprises an in-line system comprising a stepper for performing alignment and photo-exposure of a wafer and a spinner, in-line connected to the stepper, for performing coating and development of the wafer, and an overlay measurement device, in-line connected to the spinner, for automatically measuring an overlay accuracy of the wafer after wafer development is completed by the spinner.

14 Claims, 5 Drawing Sheets

IN-LINE SYSTEM HAVING OVERLAY ACCURACY MEASUREMENT FUNCTION AND METHOD FOR THE SAME

CROSS-REFERENCE TO RELATED APPLICATION

This application claims priority to Korean Patent Application No. 2001-43048 filed on Jul. 18, 2001.

BACKGROUND

1. Technical Field

The present invention relates to an overlay test of a semiconductor device, and more particularly, to a method for measuring an overlay accuracy of a semiconductor device in an in-line system.

2. Description of Related Art

High-integration of semiconductor devices is required to achieve high quality and low cost devices for competitiveness in the market. A method for fabricating high-integrated semiconductor devices comprises a scale-down process for making thinner gate oxide layers and shorter channels in transistors. According to recent trends, various fabricating technologies and relevant fabricating systems have been developed.

For mass production of semiconductor devices, each wafer is processed to construct an electronic circuit having an identical pattern on each chip of a wafer. The wafer processing comprises forming various layers on surfaces of semiconductor wafers every lot and etching certain portions of the wafers using pattern masks, selectively and repeatedly.

A photolithography process for fabricating semiconductor devices generally comprises the steps of coating, alignment, photo-exposure, development, overlay measurement and critical dimension measurement. The steps of coating and development are commonly performed with a spinner unit (or a track unit), and the steps of alignment and photo-exposure are generally performed with a stepper unit. These two units generally form in-line connection (so-called "an in-line system") for sequentially performing the above steps. In other words, an in-line system comprises the steps of coating, alignment, photo-exposure and development.

After performing the steps of coating, alignment, photo-exposure and development, a step of overlay measurement is performed using an overlay measurement device to determine whether predetermined patterns of semiconductor devices are accurately aligned. The step of overlay measurement generally measures an accuracy of an overlay pattern formed at a scribe lane between main chips of a wafer. The overlay accuracy of semiconductor devices is measured by determining whether previous device patterns formed by a previous photolithography process are properly aligned with current device patterns formed by a current photolithography process. The step of overlay measurement comprises radiating a preset light beam onto aligned wafers and detecting any reflected light beam from the wafers to compare a level difference between the previous and current device patterns.

When wafers having a diameter of 8 inches or smaller are fabricated, the step of overlay measurement is generally performed on only a few of wafers out of 25 wafers every lot in consideration of productivity of a processing line. However, when wafers are fabricated having a diameter of 12 inches or larger, the reliability of the overlay measurement decreases for each lot. For example, since a desired variance of an overlay accuracy is typically about 30 nm for highly integrated devices having a diameter of 17 inches or smaller, all wafers of a lot are checked for their overly accuracy, which may result in a variance of 20 nm. Thus, it is difficult to satisfy the desired variance for highly integrated semiconductor devices in measuring all wafers of a lot. Moreover, as a wafer diameter increases, the possibility of overlay faults increases. Furthermore, if a quarter micro design rule is applied to wafers having a diameter of 12 inches or larger, an alignment distribution fault of various wafers may cause a massive yield distribution fault. Because of such problems, a raw cost burden may be imposed in manufacturing wafers having a diameter of 12 inches.

Because the conventional overlay accuracy measurement method has disadvantages of decreasing reliability as the diameter of wafers increase and an alignment distribution fault, a whole yield test should be performed to check an overlay accuracy of all wafers in each lot.

FIG. 1 shows an in line system for performing a conventional overlay accuracy measurement method, in which a local overlay measurement device 30 is separately installed from in-line devices, i.e., a spinner 10 and a stepper 20. FIG. 2 shows conventional overlay measurement steps. In FIG. 1, steps S10, S20, S30 and S40 respectively indicate coating, alignment, photo-exposure and development of a photo-resistant layer. As shown FIG. 2, after performing an in-line process 100 (which comprises steps of coating 102, alignment & photo-exposure 104, development 106 and one lot process completion check 108), an overlay accuracy measurement step 112 for sample wafers is performed after a lot end step 110.

The conventional overlay measurement method has a disadvantage of a relatively long measurement time. For instance, if it takes about 10 minutes to measure an overlay accuracy of one wafer, it will be take multiple hours to measure the overlay accuracy of all wafers of each lot, and thus, mass production performance decreases. That is, because a user transports wafers to the overlay measurement device 30 to measure the overlay accuracy of sample wafers after completion of the development step (S40 of FIG. 1), an entire yield test requires longer time for measuring an overlay accuracy, thereby decreasing mass production performance.

As described above, a conventional overlay measurement method has disadvantage in that wafers should be loaded in a measurement device that is separate from in-line devices, thereby resulting in production delay, a reduction in the yield and a greater probability of wafer contamination. Further, a user's mistake or other job-related complexities in inputting a correction value into the stepper 20 to complement the measurement accuracy decreases the reliability in measurement of the overlay accuracy.

SUMMARY OF THE INVENTION

It is an object of the present invention to provide a method for performing an in-line overlay accuracy measurement, which is capable of solving disadvantages associated with conventional methods.

It is another object of the present invention to provide an in-line system and a method thereof, in which an in-line overlay accuracy measurement is performed after a development step, which is capable of simplifying wafer processing and reducing time for measuring overlay accuracy.

It is further object of the present invention to provide an in-line system having an overlay measurement function and a method thereof capable of performing an overlay accuracy measurement of a wafer having a larger diameter.

According to one aspect of the present invention, there is provided a system for performing wafer processing comprising a stepper for performing alignment and photo-exposure of a wafer and a spinner, in-line connected to the stepper, for performing coating and development of the wafer, and an overlay measurement device, in-line connected to the spinner, for automatically measuring an overlay accuracy of the wafer after wafer development is completed by the spinner.

According to another aspect of the present invention, there is provided a method for performing wafer processing in a system comprising a stepper, a spinner and an overlay measurement device. The method comprises the steps of: aligning and photo-exposing a wafer with the stepper; coating and developing the wafer with the spinner; and automatically measuring an overlay accuracy of the wafer with the overlay measurement device after the wafer developing step is completed, wherein the overlay measurement device is in-line connected to the spinner.

According to further aspect of the present invention, there is provided a method for performing wafer processing. The method comprises the steps of: performing an in-line process comprising the steps of alignment, photo-exposure, coating and development of a wafer; and automatically performing an overlay accuracy of the wafer without discharging the wafer after the wafer developing step is completed.

These and other objects, aspects, features, and advantages of the present invention will become apparent from the following detailed description of preferred embodiments, which is to be read in connection with the accompanying drawings.

DETAILED DESCRIPTION OF PREFERRED EMBODIMENTS

Figure 1:
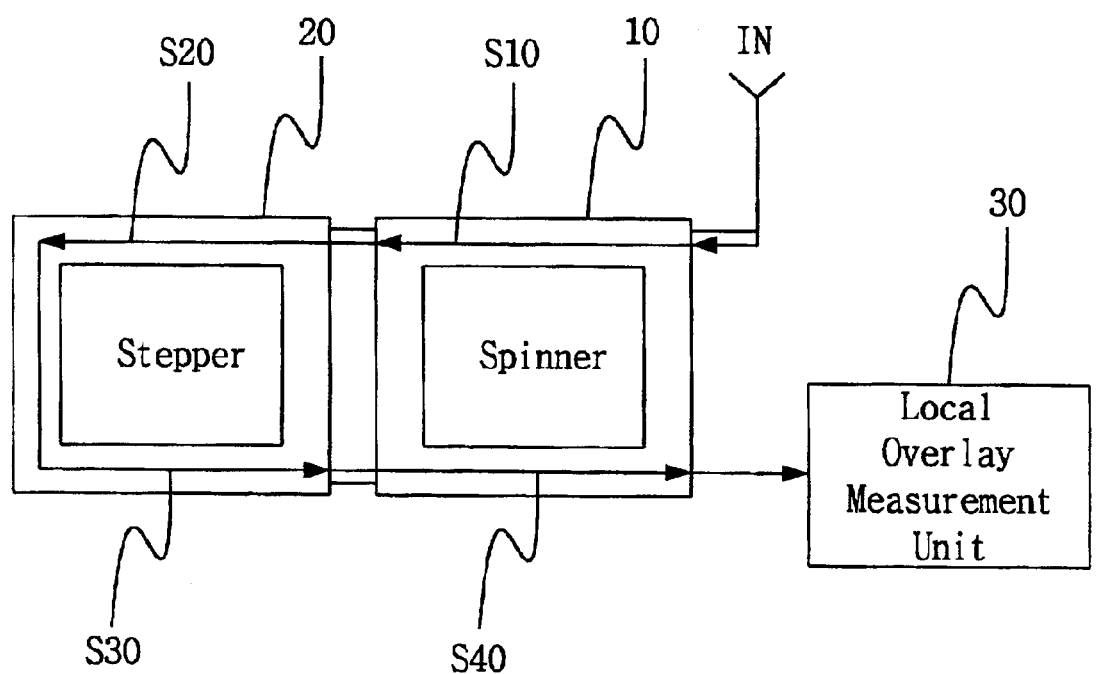
FIG. 1 is a schematic block diagram of an in-line system for performing a conventional overlay accuracy measurement method.
Figure 2:
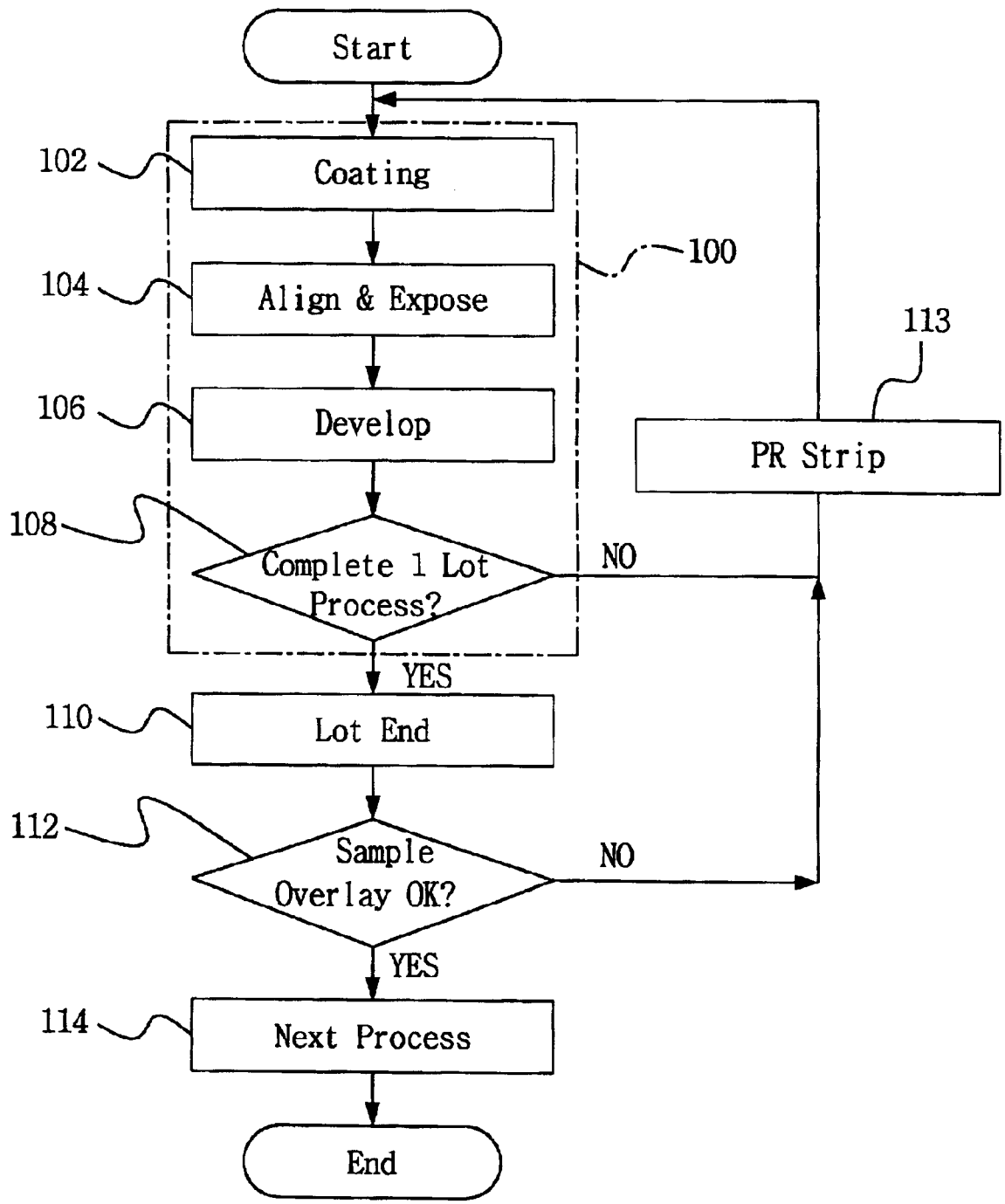
FIG. 2 is a flowchart illustrating the overlay accuracy measurement method of FIG. 1.

An in-line system comprising an overlay measurement function and an in-line overlay measurement method will be described in accordance with preferred embodiments of the present invention with reference to accompanying drawings. The same reference numerals will be used throughout the drawings for components that perform identical or similar functions.

Figure 3:
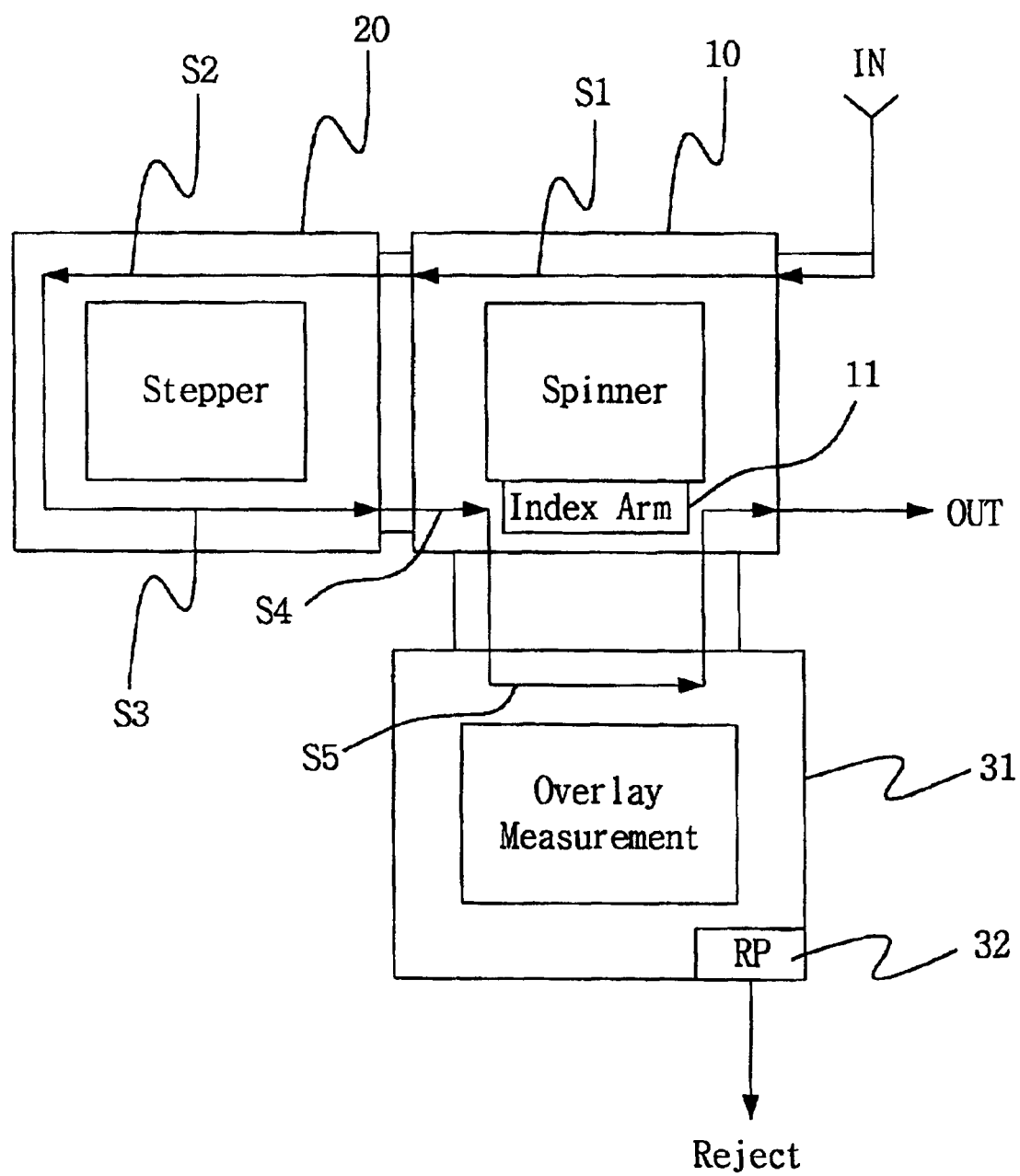
FIG. 3 is a block diagram of an in-line system for performing an in-line overlay accuracy measurement method according to an embodiment of the present invention.

FIG. 3 is a block diagram illustrating an in-line system for performing an in-line overlay measurement method according to an embodiment of the present invention. The system of FIG. 3 comprises a spinner 10, a stepper 20 and an overlay measurement device 31, all of which are interconnected in an in-line system. The overlay measurement device 31 is interconnected with the spinner 10 to thereby perform an automatic overlay measurement operation of wafers after a development step is completed by the spinner 10. For example, after performing the steps of coating (S1), alignment (S2), photo-exposure (S3) and development (S4) on wafers (that is input through IN), an overlay measurement (S5) is sequentially followed without discharging the developed wafers from the in-line system. At this time, if an error is found during the overlay measurement (S5), the wafers may be discharged through a separate rejection port (RP) 32 for a fast run management process.

In the overlay measurement (S5), the wafers are moved from the spinner 10 to the overlay measurement device 31 by bordering their input and output pedestals. It is preferable that the spinner 10 and the overlay measurement device 31 share an index arm 11 for directly loading or unloading of the wafers to the overlay measurement device 31.

Figure 4:
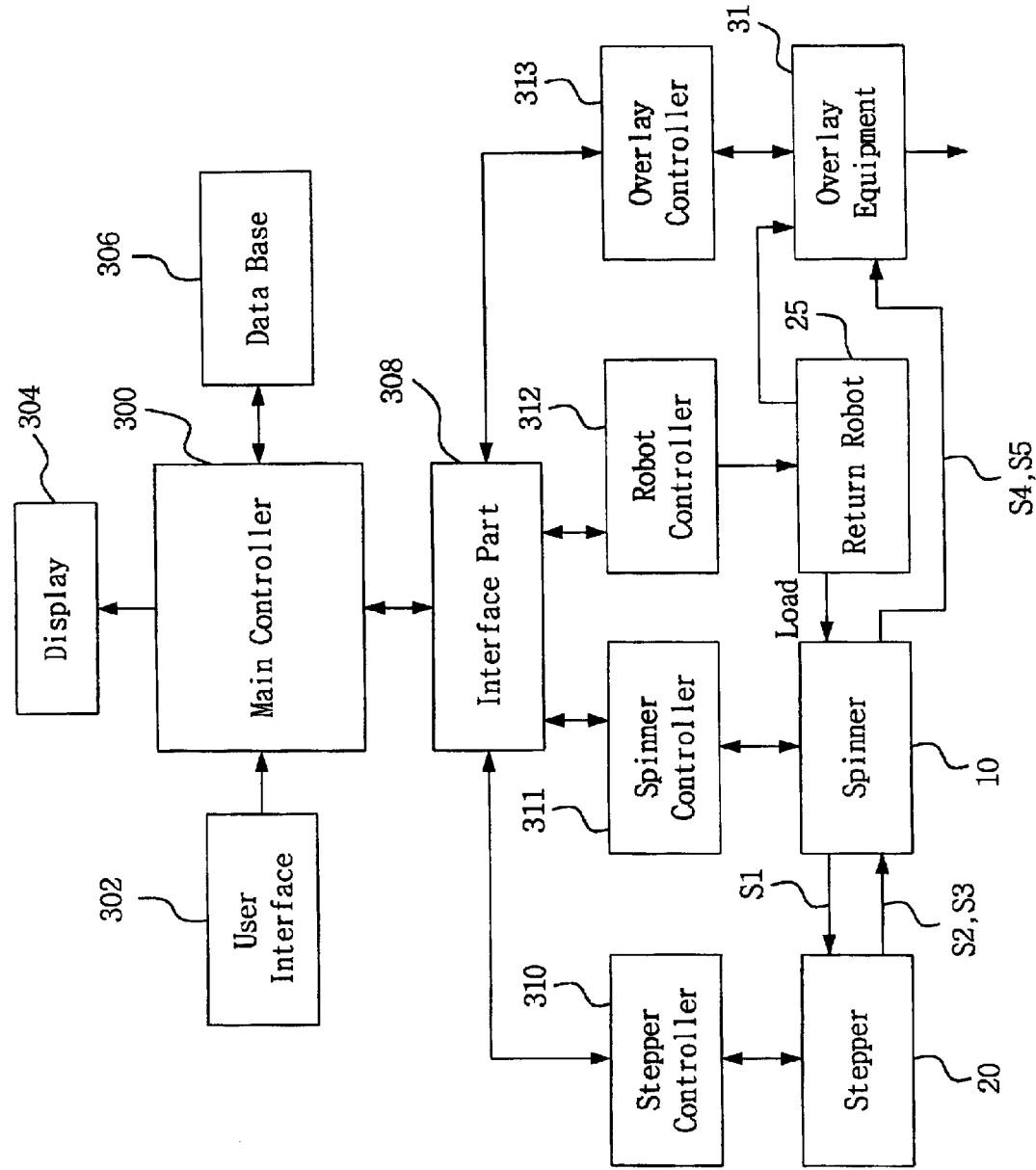
FIG. 4 is a block diagram illustrating control operations of the in-line system of FIG. 3.

FIG. 4 is a block diagram illustrating control operations of the in-line system shown in FIG. 3, according to an embodiment of the present invention. A system for controlling an in-line system comprises a user interface 302 for receiving user commands, a main controller 300 for performing all control operations of the in-line system in response to a preset program and the commands from the user interface 302, a database 306 connected to the main controller 300 for storing job-related data, a display 304 connected to the main controller 300 for displaying an operational state, an interface part 308 connected to the main controller 300 for performing an interface operation with each of a plurality of controllers including a stepper controller 310 for controlling a stepper 20, a spinner controller 311 for controlling a spinner 10, a robot controller 312 for controlling a return robot device 25 and overlay controller 313 for controlling an overlay measurement device 31.

Figure 5:
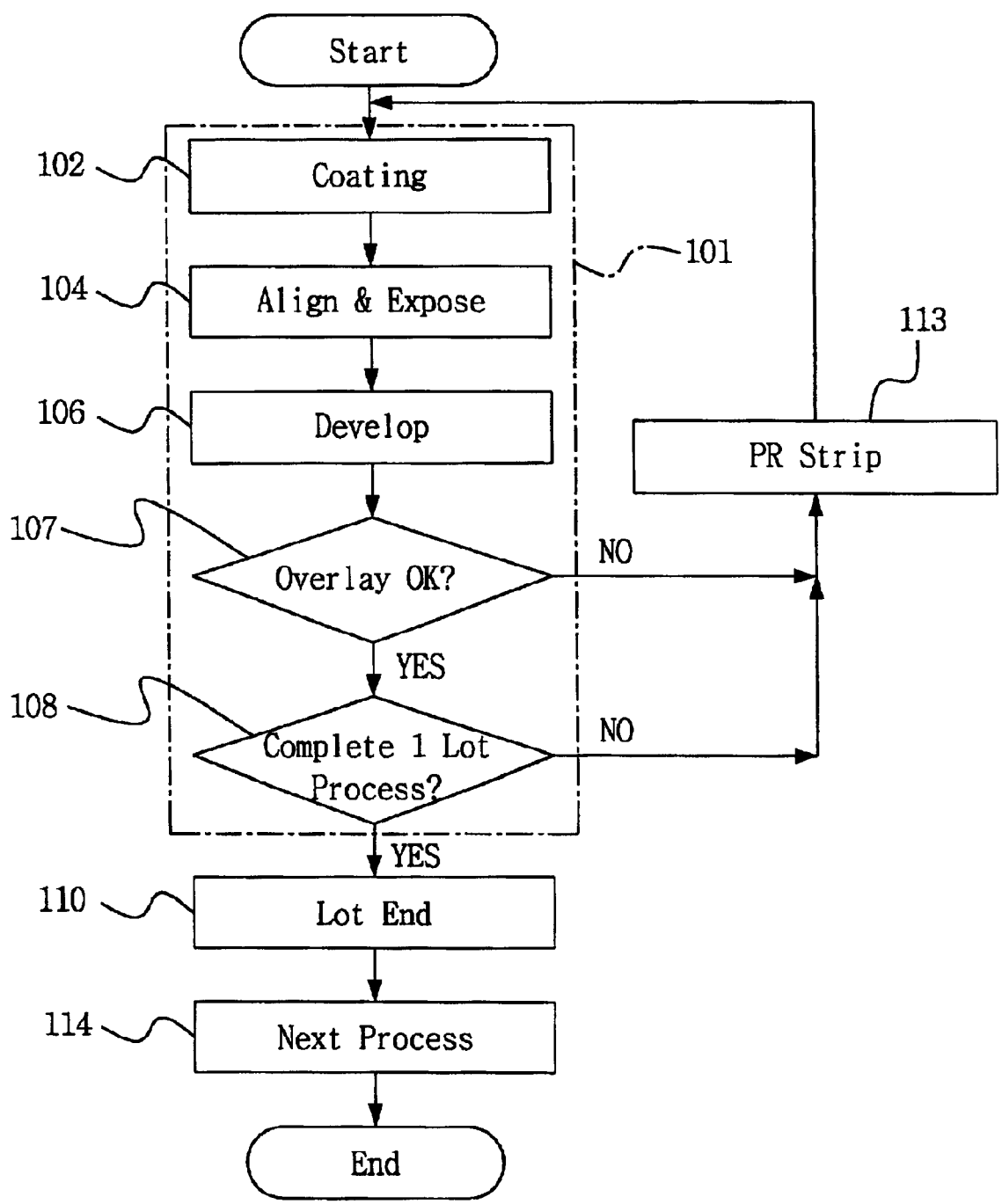
FIG. 5 is a flowchart illustrating an in-line overlay accuracy measurement method according to one aspect of the present invention.

FIG. 5 is a flowchart for illustrating an in-line overlay measurement method according to one aspect of the invention. As shown in FIG. 5, an in-line process 101 comprises the steps of coating 102, alignment and photo-exposure 104, development 106, overlay measurement 107 and one lot process completion check 108. After completion of the in-line process 101, wafer processing proceeds to a step of lot end 110 and further to the following steps. As described above, the overlay measurement 107 is performed after a wafer of each lot is developed 106. At a step of PR strip 113, a photo-resistant layer that is coated on the wafers is removed mainly by a wet etching.

On the other hand, the overlay measurement device 31 may comprise an overlay measurement stage in an overlay measurement room and a halogen light controller on an upper surface of the overlay measurement room. When wafers are transported from the spinner 10 to the overlay measurement room of the overlay measurement device 31 through the index arm 11 of the spinner 10 (which is connected in the in-line system with the overlay measurement device 31) after completion of the development step (106 in FIG. 5), light emitting and receiving elements (which are installed in the overlay measurement room) detect such movement of the wafers. Then, a halogen lamp is turned on under control of the halogen light controller. The wafers are transported to the overlay measurement stage and securely accommodated at a preset position for performing an in-line overlay measurement.

To perform the overlay measurement, a light beam emitted from the halogen lamp is radiated to the transported wafers, any light beam reflected from the wafer is detected, and a level difference of the reflected light beams between previous device patterns and current device patterns by the main controller 300 (which communicates with the overlay controller 313) is compared. A further detailed description of a preferred overlay measurement is disclosed in U.S. Pat. No. 5,468,580 issued on Nov. 21, 1995 to Yasushi Tanaka, which is incorporated herein by reference. With this process, after forming first and second overlay measurement patterns, a variance in the overlay accuracy between the measurement patterns is measured.

In a further embodiment of the present invention, an overlay testing method may be applied for compensating errors that occur in an overlay measurement to thereby improve the accuracy of an overlay measurement method as described above. An example of a preferred overlay testing method is described in U.S. Pat. No. 5,766,809 issued on Jun. 16, 1998 to Sang Man, which is incorporated herein by reference.

According to an embodiment of the present invention, overlay patterns may be produced according to the following steps. First, a photo-resistant material is coated on a substrate, which is photo-exposed and developed to form an inner box. A predetermined layer is coated on the substrate comprising the inner box. Secondly, a photo-resistant material is further coated onto the coated substrate, which is photo-exposed and developed to form an outer box (which has a larger area than the area of the inner box). In addition, an embodiment of the present invention may implement an overlay detection pattern as disclosed in U.S. Pat. No. 5,633,505 issued on May 27, 1997 to Wen-Jye Chung, et al, which is incorporated herein by reference.

Advantageously, an in-line system according to the present invention for performing an overlay measurement method improves the productivity of a wafer processing of wafers having a diameter 12 inches or larger, because the overlay measurement method is performed in an in-line system, thereby decreasing measurement time and simplifying the related job operations. While the invention has been described in terms of preferred embodiments, those skilled in the art will recognized that the invention could be practiced with modification within the spirit and scope of the appended claims. For instance, it is possible to variedly transform or modify the shape of an overlay measurement device in an in-line system or an overlay measurement method.

As described above, an in-line overlay measurement system according to the invention decreases measurement time and simplifies the related job operations. Therefore, an in-line overlay measurement system of the present invention advantageously improves productivity and reduces a raw cost in applying to wafers having a larger diameter.

What is claimed is:

1. A system for performing wafer processing, comprising:
   an in-line system comprising a stepper for performing alignment and photo-exposure of a wafer and a spinner, in-line connected to the stepper, for performing a coating and development of the wafer; and
   an overlay measurement device, in-line connected to the spinner, for automatically measuring an overlay accuracy of the wafer after wafer development is completed by the spinner to determine whether device patterns are accurately aligned.

2. The system of claim 1, wherein the overlay measurement device is in-line connected to an index arm of the spinner.

3. The system of claim 2, wherein the wafer is transported from the spinner to the overlay measurement device by bordering input and output pedestals of the spinner and overlay measurement device.

4. The system of claim 2, wherein the index arm of the spinner directly loads or unloads the wafer on the overlay measurement device.

5. The system of claim 1, wherein the overlay measurement device further comprises a reject port for discharging a faulty wafer found during an overlay measurement.

6. A method for performing wafer processing in a system comprising a stepper, a spinner and an overlay measurement device, comprising the steps of:
   aligning and photo-exposing a wafer with the stepper;
   coating and developing the wafer with the spinner; and
   automatically measuring an overlay-accuracy of the wafer with the overlay measurement device after the wafer developing step is completed to determine whether device patterns are accurately aligned, wherein the overlay measurement device is in-line connected to the spinner.

7. The method of claim 6, wherein the wafer comprises a diameter of at least about 12 inches.

8. The method of claim 6, wherein the step of measuring the overlay accuracy of the wafer comprises the step of in-line connecting the overlay measurement device to an index arm of the spinner.

9. The method of claim 8, wherein the step of measuring the overlay accuracy of the wafer further comprises the step of directly loading or unloading the wafer on the overlay measurement device by the index arm of the spinner.

10. The method of claim 6, wherein the step of measuring the overlay accuracy of the wafer comprises the step of receiving the wafer from the spinner by bordering input and output pedestals of the spinner and the overlay measurement device.

11. The method of claim 6, wherein the step of measuring the overlay accuracy of the wafer comprises the step of rejecting a faulty wafer.

12. A method for performing wafer processing, comprising the steps of:
   performing an in-line process comprising the steps of alignment, photo-exposure, coating and development of a wafer; and
   automatically performing an overlay accuracy of the wafer without discharging the wafer after the wafer developing step is completed to determine whether device patterns are accurately aligned.

13. The method of claim 12, wherein the wafer comprises a diameter of at least about 12 inches.

14. The method of claim 12, further comprising the step of discharging a faulty wafer found during the step of performing the overlay accuracy of the wafer.

* * * * *